(12) United States Patent
Kim

(10) Patent No.: US 8,770,823 B2
(45) Date of Patent: Jul. 8, 2014

(54) SILICON-BASED COOLING PACKAGE FOR LIGHT-EMITTING DEVICES

(76) Inventor: Gerald Ho Kim, Carlsbad, CA (US)

( * ) Notice: Subject to any disclaimer, the term of this patent is extended or adjusted under 35 U.S.C. 154(b) by 287 days.

(21) Appl. No.: 13/359,592

(22) Filed: Jan. 27, 2012

(65) Prior Publication Data

US 2012/0195051 A1     Aug. 2, 2012

Related U.S. Application Data

(60) Provisional application No. 61/437,598, filed on Jan. 29, 2011.

(51) Int. Cl.
*F21V 33/00*     (2006.01)

(52) U.S. Cl.
USPC ..................................... 362/646; 362/249.02

(58) Field of Classification Search
USPC ..................................... 362/249.02, 646, 97.3
See application file for complete search history.

(56) References Cited

U.S. PATENT DOCUMENTS

| | | | |
|---|---|---|---|
| 8,338,840 B2 * | 12/2012 | Lerman et al. | 257/88 |
| 8,338,841 B2 * | 12/2012 | Lerman et al. | 257/88 |
| 8,354,686 B2 * | 1/2013 | Jin et al. | 257/98 |
| 2007/0217202 A1 | 9/2007 | Sato | |
| 2008/0094835 A1 | 4/2008 | Marra et al. | |
| 2009/0001558 A1 | 1/2009 | Shiau | |
| 2009/0080487 A1 | 3/2009 | Onishi | |
| 2011/0075438 A1 * | 3/2011 | Shirai et al. | 362/538 |
| 2011/0090691 A1 * | 4/2011 | Markle et al. | 362/249.02 |
| 2011/0310604 A1 * | 12/2011 | Shimizu et al. | 362/235 |
| 2011/0310609 A1 * | 12/2011 | Kawashima et al. | 362/249.02 |
| 2011/0317412 A1 * | 12/2011 | Paik et al. | 362/235 |
| 2012/0002421 A1 * | 1/2012 | Takahasi et al. | 362/249.02 |

FOREIGN PATENT DOCUMENTS

WO     WO2010026522     3/2010

* cited by examiner

*Primary Examiner* — Laura Tso
(74) *Attorney, Agent, or Firm* — Andy M. Han

(57) ABSTRACT

Various embodiments of a thermal energy transfer apparatus that removes thermal energy from a light-emitting device are described. In one aspect, an apparatus comprises a silicon-based base plate and a silicon-based cover element disposed on the base plate. The base plate includes a recess to receive a light-emitting device therein. The base plate is coated with a first electrically-conductive pattern that forms a first electrode. The base plate is further coated with a second electrically-conductive pattern that is electrically isolated from the first electrically-conductive pattern. The cover element holds the light-emitting device between the base plate and the cover element with at least a portion of a light-emitting surface of the light-emitting device exposed. The cover element is coated with a third electrically-conductive pattern that is in contact with the second electrically-conductive pattern to form a second electrode when the cover element is disposed on the base plate.

15 Claims, 9 Drawing Sheets

SILICON-BASED COOLING PACKAGE FOR LIGHT-EMITTING DEVICES

CROSS-REFERENCE TO RELATED APPLICATION

This application claims the priority benefit of U.S. Provisional Patent Application No. 61/437,598, filed on Jan. 29, 2011, the entirety of which is hereby incorporated by reference and made a part of this specification.

BACKGROUND

1. Technical Field

The present disclosure generally relates to the field of transfer of thermal energy and, more particularly, to removal of thermal energy from a light-emitting device.

2. Description of the Related Art

Light-emitting devices, such as vertical-cavity surface-emitting lasers (VCSEL), light-emitting diodes (LED), laser diodes and the like, generate thermal energy, or heat, when in operation. The heat generated by a light-emitting device needs to be removed, or dissipated, from the light-emitting device in order to allow the light-emitting device to achieve optimum performance while keeping the light-emitting device within a safe operating temperature range. With the form factor of light-emitting devices and the applications they are implemented in becoming ever more compact, it is imperative to effectively dissipate the high-density heat generated in an area of small footprint to ensure the safe operation and optimum performance of light-emitting devices.

Many metal-based heat dissipation packages, whether water-cooled or air-cooled, have been developed for use in compact packages to dissipate heat generated by light-emitting devices. For instance, heat exchangers and heat pipes made of a material with high thermal conductivity, such as copper, copper-tungsten alloy, aluminum or iron, for example, are commercially available. However, most metal-based heat exchangers and heat pipes experience oxidation, corrosion and/or crystallization after long periods of operation. Such fouling factors significantly reduce the efficiency of heat transfer of metal-based cooling packages. Other problems associated with metal-based cooling packages include, for example, difficulty in precision alignment in mounting laser diode bars, VCSELs or LEDs or chips in laser diode/VCSEL/LED cooling applications, issues with overall compactness of the package, corrosion of the metallic material in water-cooled applications, difficulty in manufacturing, etc. Yet, increasing demand for higher power density in small form factor motivates the production of a compact cooling package with fewer or none of the aforementioned issues. Moreover, conventional packages typically use wire bonding to provide electrical power to the light-emitting device, but wire bonding may add cost and complexity in manufacturing and may be prone to defects in addition to occupying space unnecessarily.

SUMMARY

Various embodiments of a silicon-based thermal energy transfer apparatus, or a cooling package, for light-emitting devices are described herein. The novel and non-obvious silicon-based thermal energy transfer apparatus provides a compact form factor, achieves better thermal conductivity than conventional metal-based cooling packages, and is more cost effective. The thermal energy transfer apparatus advantageously removes thermal energy from a light-emitting device and allows electrical power to be provided to the light-emitting device without using wire bonding.

According to one aspect, an apparatus may comprise a base plate made of a silicon-based material or a ceramic material and a cover element made of a silicon-based material or a ceramic material. The base plate may include a recess configured to receive a light-emitting device therein. A first area of the base plate may be coated with a first electrically-conductive pattern that forms a first electrode for powering the light-emitting diode. A second area of the base plate may be coated with a second electrically-conductive pattern that is electrically isolated from the first electrically-conductive pattern. The cover element may be configured to be disposed on the base plate to hold the light-emitting device between the base plate and the cover element with at least a portion of a light-emitting surface of the light-emitting device exposed. An area of the cover element may be coated with a third electrically-conductive pattern that is in contact with the second electrically-conductive pattern to form a second electrode together with the second electrically-conductive pattern for powering the light-emitting device when the cover element is disposed on the base plate.

In at least one embodiment, the base plate may include a first primary surface and a second primary surface opposite to the first primary surface. The first primary surface may include a non-recessed area and the recess to receive the light-emitting device in the recess. At least a portion of the recess and a first portion of the non-recessed area may be contiguously coated with the first electrically-conductive pattern. A second portion of the non-recessed area may be coated with the second electrically-conductive pattern. The cover element may include a first primary surface and a second primary surface opposite to the first primary surface. The first primary surface of the cover element may be coated with the third electrically-conductive pattern that is configured to be in contact with the second electrically-conductive pattern when the cover element is disposed on the base plate with the first primary surface of the cover element facing the first primary surface of the base plate.

In at least one embodiment, the recess may include a main portion and a channel portion with the main portion dimensioned to receive the light-emitting device therein. A first part of the first electrically-conductive pattern may be disposed in the main portion and the channel portion of the recess. A second part of the first electrically-conductive pattern that is contiguous with the first part of the first electrically-conductive pattern may be disposed on the first portion of the non-recessed area of the first primary surface of the base plate. The cover element may not be in contact with the second part of the first electrically-conductive pattern when the cover element is disposed on the base plate.

In at least one embodiment, the apparatus may further comprise a layer of thermally-conductive material disposed between at least a portion of the recess and at least a portion of the first electrically-conductive pattern.

In at least one embodiment, the layer of thermally-conductive material may comprise diamond, copper, or silver.

In at least one embodiment, the apparatus may further comprise a layer of metallic material, disposed on at least a portion of the second primary surface of the base plate, that bonds the base plate to an external object.

In at least one embodiment, the apparatus may further comprise a collimating element disposed on the cover element. The collimating element may include a lens portion that collimates light emitted from the light-emitting device along a predefined direction. The collimating element may be made of glass, polymer, or quartz.

In at least one embodiment, the apparatus may further comprise a spacer element disposed on the collimating element with the collimating element disposed between the spacer element and the cover element. The spacer element may include an opening that accommodates at least the lens portion of the collimating element and allows the light emitted from the light-emitting device to propagate through the spacer element. The spacer element may be made of silicon or ceramic.

In at least one embodiment, the apparatus may further comprise a window element disposed on the spacer element with the spacer element disposed between the window element and the collimating element. The window element is substantially transparent.

In at least one embodiment, the apparatus may further comprise a VCSEL that is received in the recess of the base plate and disposed between the base plate and the cover element to receive electrical power from the first electrode and the second electrode.

In at least one embodiment, the apparatus may further comprise a LED that is received in the recess of the base plate and disposed between the base plate and the cover element to receive electrical power from the first electrode and the second electrode.

According to another aspect, an apparatus may comprise a base plate made of a silicon-based material or a ceramic material and a cover element made of a silicon-based material or a ceramic material. The base plate may include a first primary surface and a second primary surface opposite to the first primary surface. The first primary surface may include a non-recessed area and a recess to receive the light-emitting device in the recess. At least a portion of the recess and a first portion of the non-recessed area may be contiguously coated with a first electrically-conductive pattern that forms a first electrode for powering the light-emitting diode. A second portion of the non-recessed area may be coated with a second electrically-conductive pattern that is electrically isolated from the first electrically-conductive pattern. The cover element may be configured to be disposed on the base plate to hold the light-emitting device between the base plate and the cover element. The cover element may include a first primary surface and a second primary surface that is opposite to the first primary surface. The first primary surface of the cover element may be coated with a third electrically-conductive pattern that is configured to be in contact with the second electrically-conductive pattern to form a second electrode for powering the light-emitting device when the cover element is disposed on the base plate with the first primary surface of the cover element facing the first primary surface of the base plate. The cover element may further include an opening communicatively connecting the first primary surface of the cover element and the second primary surface of the cover element. The opening may expose at least a portion of a light-emitting surface of the light-emitting device.

According to a further aspect, an apparatus may comprise a base plate made of a silicon-based material or a ceramic material and a cover element made of a silicon-based material or a ceramic material. The base plate may include a first primary surface and a second primary surface opposite to the first primary surface. The first primary surface may include a non-recessed area and a recess to receive the light-emitting device in the recess. At least a portion of the recess and a first portion of the non-recessed area may be contiguously coated with a first electrically-conductive pattern that forms a first electrode for powering the light-emitting diode. A layer of thermally-conductive material may be disposed between at least a portion of the recess and at least a portion of the first electrically-conductive pattern. A second portion of the non-recessed area may be coated with a second electrically-conductive pattern that is electrically isolated from the first electrically-conductive pattern. The cover element may be configured to be disposed on the base plate to hold the light-emitting device between the base plate and the cover element with at least a portion of a light-emitting surface of the light-emitting device exposed. The cover element may include a first primary surface and a second primary surface opposite to the first primary surface. The first primary surface of the cover element may be coated with a third electrically-conductive pattern. The third electrically-conductive pattern may be configured to be in contact with the second electrically-conductive pattern to form a second electrode for powering the light-emitting device when the cover element is disposed on the base plate with the first primary surface of the cover element facing the first primary surface of the base plate.

These and other objectives of the present disclosure will be appreciated by those of ordinary skill in the art after reading the following detailed description of the preferred embodiments that are illustrated in the various figures and drawings.

BRIEF DESCRIPTION OF THE DRAWINGS

In the detailed description that follows, embodiments are described as illustrations since various changes and modifications will become apparent to those skilled in the art from the following detailed description. The use of the same reference numbers in different indicates similar or identical items. It is appreciable that the figures are not necessarily in scale as some components may be shown as out of proportion than the size in actual implementation in order to clearly illustrate the concept of the present disclosure.

DETAILED DESCRIPTION

Overview

The present disclosure describes embodiments of a thermal energy transfer apparatus that removes thermal energy from a light-emitting device and allows electrical power to be provided to the light-emitting device without using wire bonding. While aspects of described techniques relating to a thermal energy transfer apparatus that removes thermal energy from a light-emitting device can be implemented in any number of different applications, the disclosed embodiments are described in context of the following exemplary configurations.

Illustrative First Thermal Energy Transfer Apparatus

Figure 1:
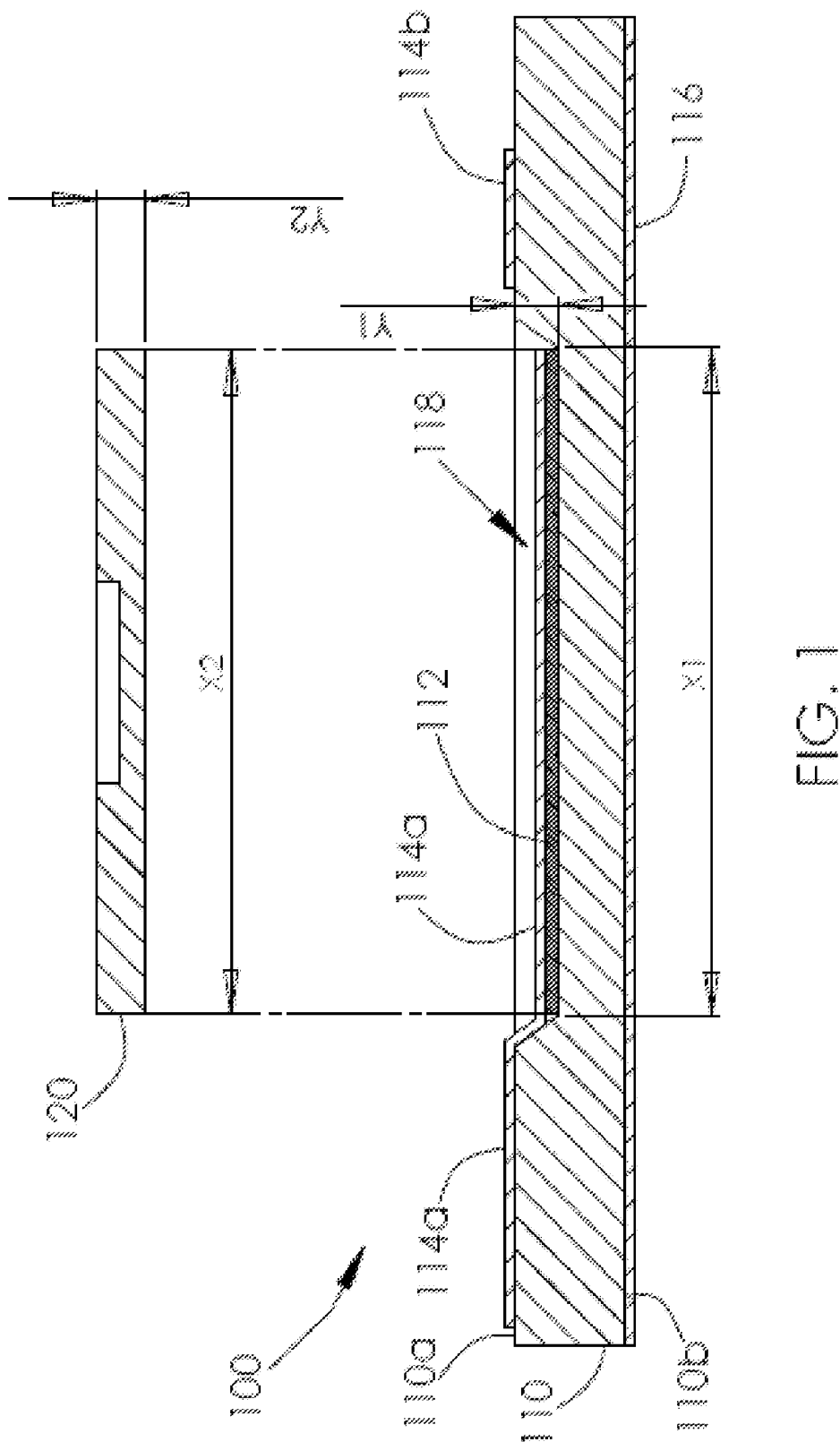
FIG. 1 illustrates a side view of a thermal energy transfer apparatus for a light-emitting device in accordance with one embodiment of the present disclosure.
Figure 2:
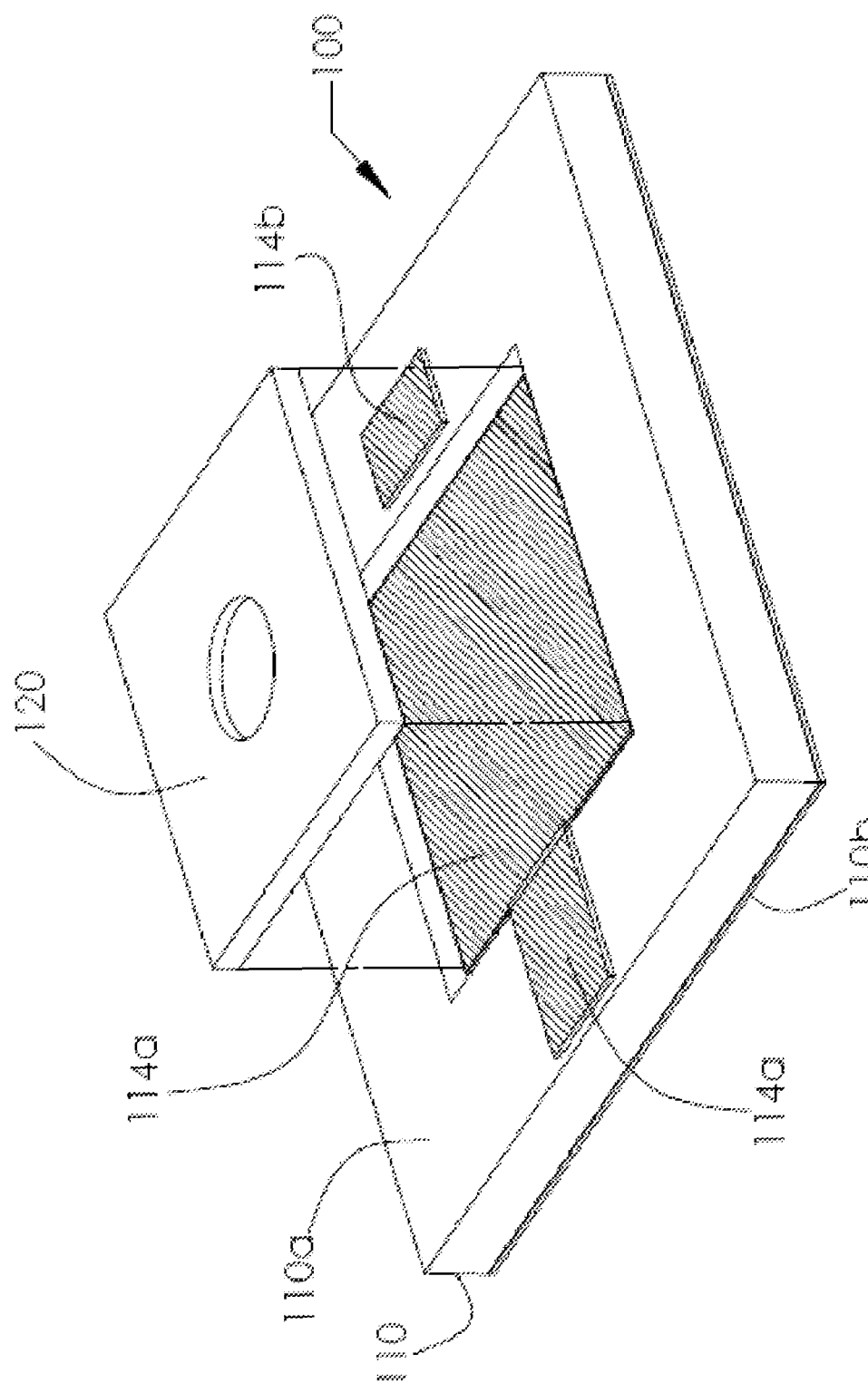
FIG. 2 illustrates an assembly view of the thermal energy transfer apparatus of FIG. 1.

FIGS. 1 and 2 illustrate an embodiment of a thermal energy transfer apparatus 100 that removes thermal energy from a light-emitting device 120 when the light-emitting device 120 is bonded to or otherwise attached to the thermal energy transfer apparatus 100. The thermal energy transfer apparatus 100 comprises a base plate 110 that has a first primary surface 110a and a second primary surface 110b opposite to the first primary surface 110a.

In at least one embodiment, the base plate 110 may be made of a silicon-based material. For example, the base plate 110 may be fabricated from a silicon wafer, such as a single-crystal silicon wafer. Accordingly, batch manufacturing of a plurality of base plates 110 from a single silicon wafer may be achieved using known or to-be-developed semiconductor or micro-electromechanical-system (MEMS) fabrication processes for high production volume with high yield rate. Alternatively, the base plate 110 may be made of a ceramic material such as, for example, aluminum nitride (AlN).

The base plate 110 has a recess 118 on the first primary surface 110a. The recess 118 is dimensioned to receive the light-emitting device 120 substantially exactly such that the light-emitting device 120 cannot be moved in a direction substantially parallel to the first primary surface 110a or the second primary surface 110b when the light-emitting device 120 is received in the recess. That is, one or more dimensions of the recess 118 are fabricated to substantially match one or more dimensions of the light-emitting diode 120 in order to allow the light-emitting device 120 to fit snuggly in the recess 118 when the light-emitting device 120 is bonded, or otherwise attached, to the base plate 110 by being received in the recess 118.

For illustrative purpose, assuming the light-emitting device 120 has a width dimension X2, as shown in FIG. 1, preferably the bottom of the recess 118 has a dimension X1 that is the same as or substantially the same as X2.

Moreover, the recess 118 has a depth Y1, as shown in FIG. 1, such that the top surface of the light emitting device 120 is higher than the first primary surface 110a when the bottom surface of the light-emitting device 120, which is opposite the top surface, is received in the recess 118. In other words, the depth Y1 of the recess 118 is at least the same as or less than the height Y2 of the light-emitting device 120.

In at least one embodiment, at least a portion of the first primary surface 110a of the base plate 110 that is not recessed (hereinafter referred to as the "non-recessed area") and at least a portion of the recess 118 may be contiguously coated with a first electrically-conductive pattern 114a that forms a first electrode for powering the light-emitting device 120. That is, the portion of the first electrically-conductive pattern 114a that is disposed on the recess 118 and the portion of the first electrically-conductive pattern 114a that is disposed on the non-recessed area of the first primary surface 110a are contiguous and hence electrically coupled together. When the light-emitting device 120 is received in the recess 118, the light-emitting device 120 contacts, and hence is electrically coupled to, the first electrically-conductive pattern 114a.

In at least one embodiment, at least a portion of the recess 118 that is covered by the light-emitting device 120 when the light-emitting device 120 is received in the recess 118 may be coated with a layer of thermally-conductive material 112. During operation, the layer of thermally-conductive material 112 aids the transfer of thermal energy, or heat, from the light-emitting device 120 to the base plate 110 by conduction to dissipate at least some of the heat generated by the light-emitting device 120. This tends to enhance the performance as well as longevity of the light-emitting device 120. In at least one embodiment, the layer of thermally-conductive material 112 may comprise diamond. In another embodiment, the layer of thermally-conductive material 112 may comprise copper. Alternatively, the layer of thermally-conductive material 112 may comprise silver.

In at least one embodiment, the non-recessed area of the first primary surface 110a of the base plate 110 and at least a portion of the layer of thermally-conductive material 112 may be contiguously coated with the first electrically-conductive pattern 114a such that the light-emitting device 120 contacts, and hence is electrically coupled to, the first electrically-conductive pattern 114a when the light-emitting device 112 is received in the recess 118 of the base plate 110.

Moreover, at least another portion of the first primary surface 110a of the base plate 110 that is not recessed and not coated with the first electrically-conductive pattern 114a is coated with a second electrically-conductive pattern 114b. The first electrically-conductive pattern 114a and the second electrically-conductive pattern 114b are electrically isolated from each other.

With the bottom of the recess 118 coated with the layer of thermally-conductive material 112 and the first electrically-conductive pattern 114a, when the depth Y1 of the recess 118 is the same as, or even slightly less than, the height Y2 of the light-emitting device 120 the top surface of the light-emitting device 120 will still be higher than the first primary surface 110a of the base plate 110 when the light-emitting device 120 is received in the recess 118.

In at least one embodiment, at least a portion of the second primary surface 110b is coated with a layer of metallic material 116. The layer of metallic material 116 allows the bonding of the base plate 110 to an external object, such as a heat sink which may be, for example, a substrate, a printed circuit board (PCB), a passive cooler, an active cooler, etc. In another embodiment, the second primary surface 110b is configured to allow the base plate 110 to be mounted on, bonded to, or otherwise attached to a heat sink which may be, for example, a substrate, a PCB, a passive cooler, an active cooler, etc. This would allow heat transferred from the light-emitting device 120 to the base plate 110 to be further transferred to such a heat sink for dissipation, thus further aiding heat removal from the light-emitting device 120.

Illustrative Second Thermal Energy Transfer Apparatus

FIGS. 3-6 illustrate another embodiment of the thermal energy transfer apparatus 100, which comprises one or more additional components than that shown in FIGS. 1 and 2, as described below.

In at least one embodiment, in addition to the base plate 110, the thermal energy transfer apparatus 100 may further comprise a cover element 130. The cover element 130 has a second primary surface 130a and a first primary surface 130b that is opposite to the second primary surface 130a. The cover element 130 further has an opening 135 such that a portion of the top surface, e.g., a light-emitting surface, of the light-emitting device 120 is exposed and another portion of the top surface of the light-emitting device 120 is in contact with the first primary surface 130b of the cover element 130 when the light-emitting device 120 is received in the recess 118 of the base plate 110 with the cover element 130 disposed on, mounted on, or otherwise bonded to, the base plate 110 to hold the light-emitting device 120 between the cover element 130 and the base plate 110.

In at least one embodiment, the cover element 130 may be made of a silicon-based material. For example, the cover element 130 may be fabricated from a silicon wafer, such as a single-crystal silicon wafer. Accordingly, batch manufacturing of a plurality of cover elements 130 from a single silicon wafer may be achieved using known or to-be-developed semiconductor or MEMS fabrication processes for high production volume with high yield rate. Alternatively, the cover element 130 may be made of a ceramic material such as, for example, aluminum nitride.

In at least one embodiment, at least a portion of the first primary surface 130b of the cover element 130 may be metalized with a metallization layer 132 (hereinafter interchangeably referred to as the "third electrically-conductive pattern"). The third electrically-conductive pattern 132, may be in contact with the light-emitting device 120 and the second electrically-conductive pattern 114b that is coated on the first primary surface 110a of the base plate 110 when the cover element 130 is disposed on, mounted on, or otherwise bonded to, the base plate 110 with the light-emitting device 120 between the cover element 130 and the base plate 110. The third electrically-conductive pattern 132 and the second electrically-conductive pattern 114b form a second electrode for powering the light-emitting device 120. The third electrically-conductive pattern 132 is electrically isolated from the first electrically-conductive pattern 114a. The cover element 130 may be configured such that at least a portion of the first electrically-conductive pattern 114a on the non-recessed area of the first primary surface 110a of the base plate 110 and at least a portion of the second electrically-conductive pattern 114b on the non-recessed area of the first primary surface 110a of the base plate 110 are exposed when the cover element 130 is disposed on, mounted on, or otherwise bonded to, the base plate 110 with the light-emitting device 120 between the cover element 130 and the base plate 110. This way, each of the exposed portions of the first and second electrodes, i.e., the exposed portion of the first electrically-conductive pattern 114a and the exposed portion of the second electrically-conductive pattern 114b, may receive electrical power from respective electrical contacts to power the light-emitting device 120. This is because the top surface of the light-emitting device 120 is in contact with the third electrically-conductive pattern 132 on the cover element 130, which is in contact with the second electrically-conductive pattern 114b, while the bottom surface of the light-emitting device 120 is in contact with the first electrically-conductive pattern 114a. Such novel and non-obvious design avoids the need of wire bonding to power the light-emitting device 120, thus eliminating the complexity and costs associated with wire bonding.

Figure 3:
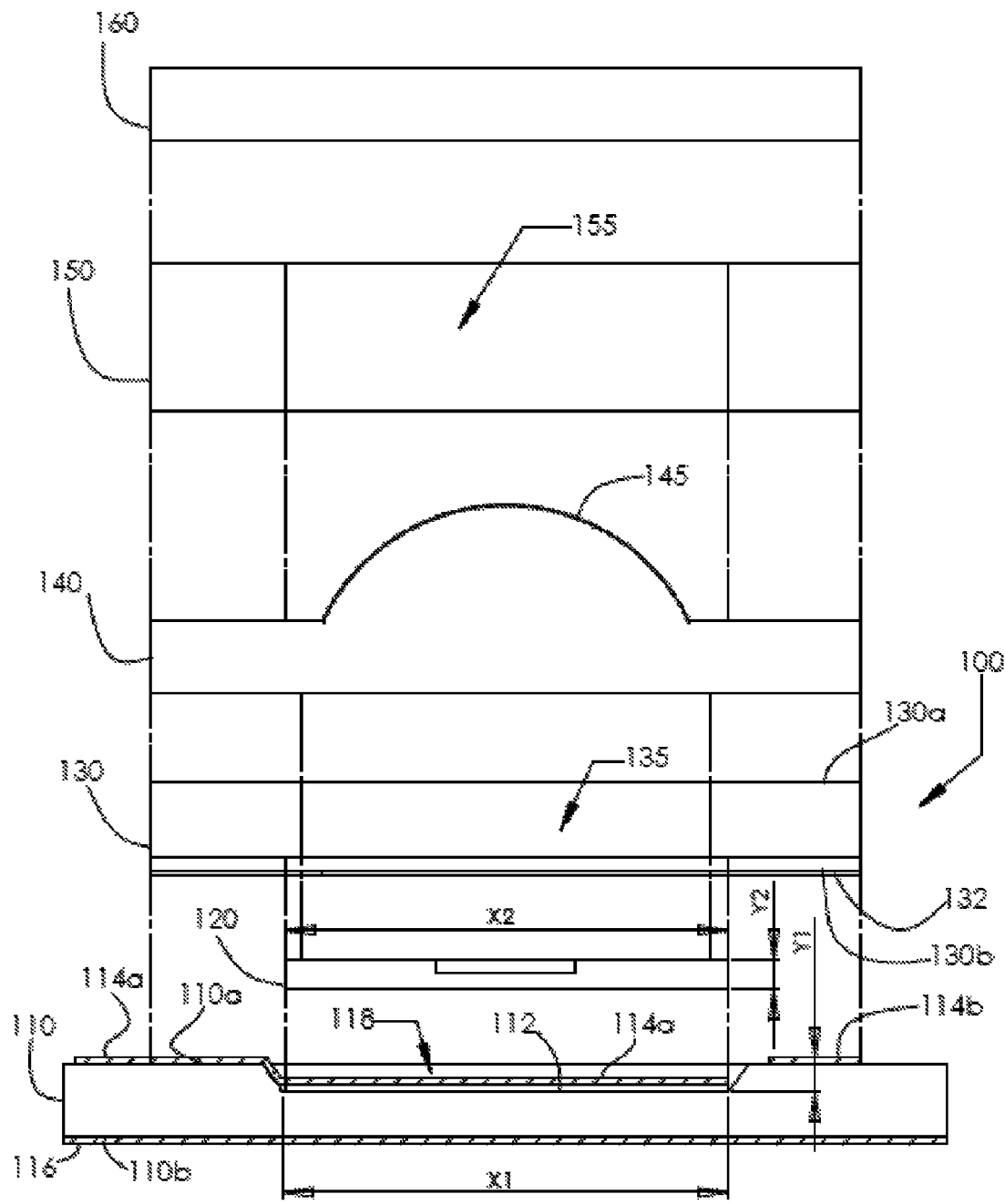
FIG. 3 illustrates an exploded side view of a thermal energy transfer apparatus for a light-emitting device in accordance with another embodiment of the present disclosure.
Figure 4:
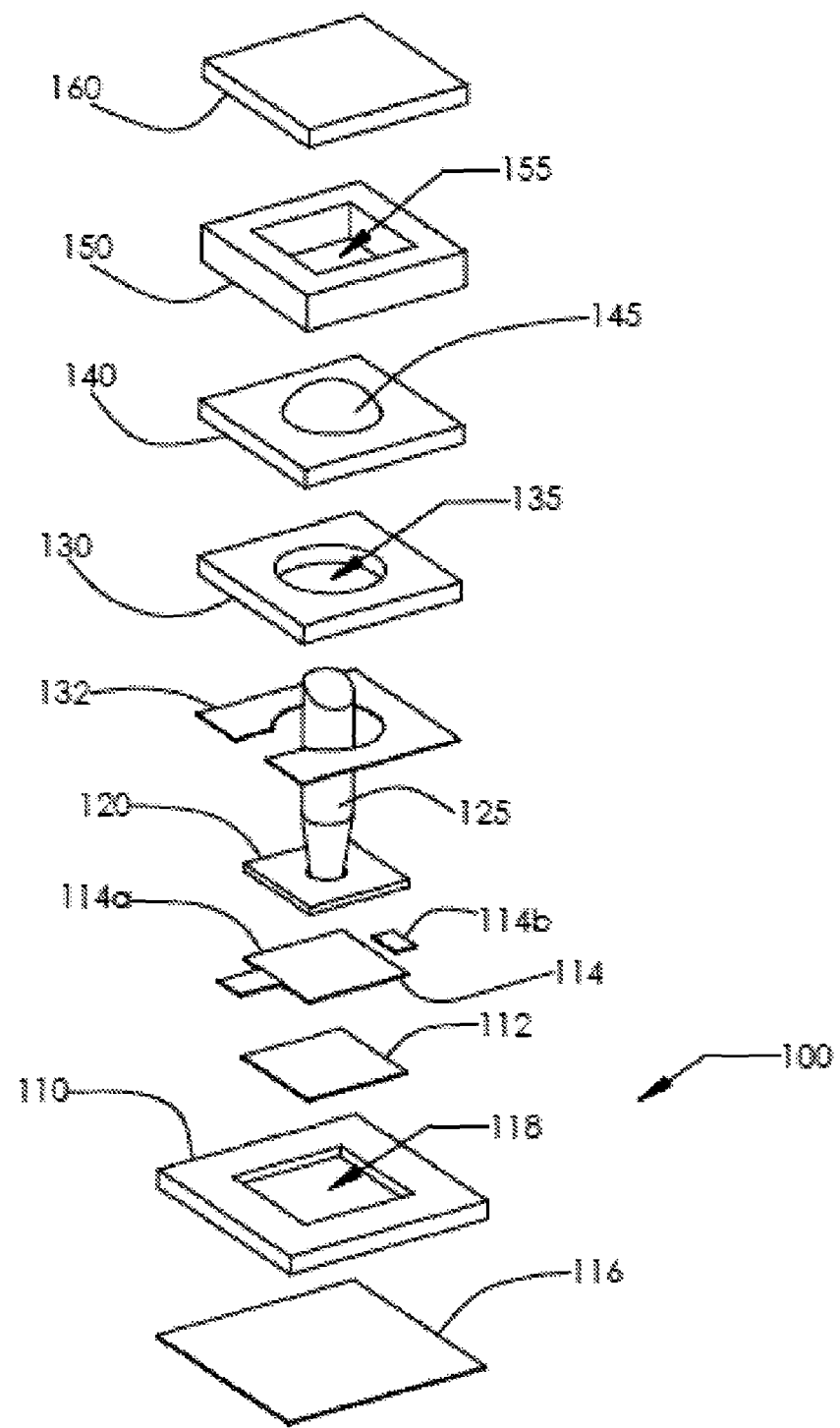
FIG. 4 illustrates an exploded isometric view of the thermal energy transfer apparatus of FIG. 3.
Figure 5:
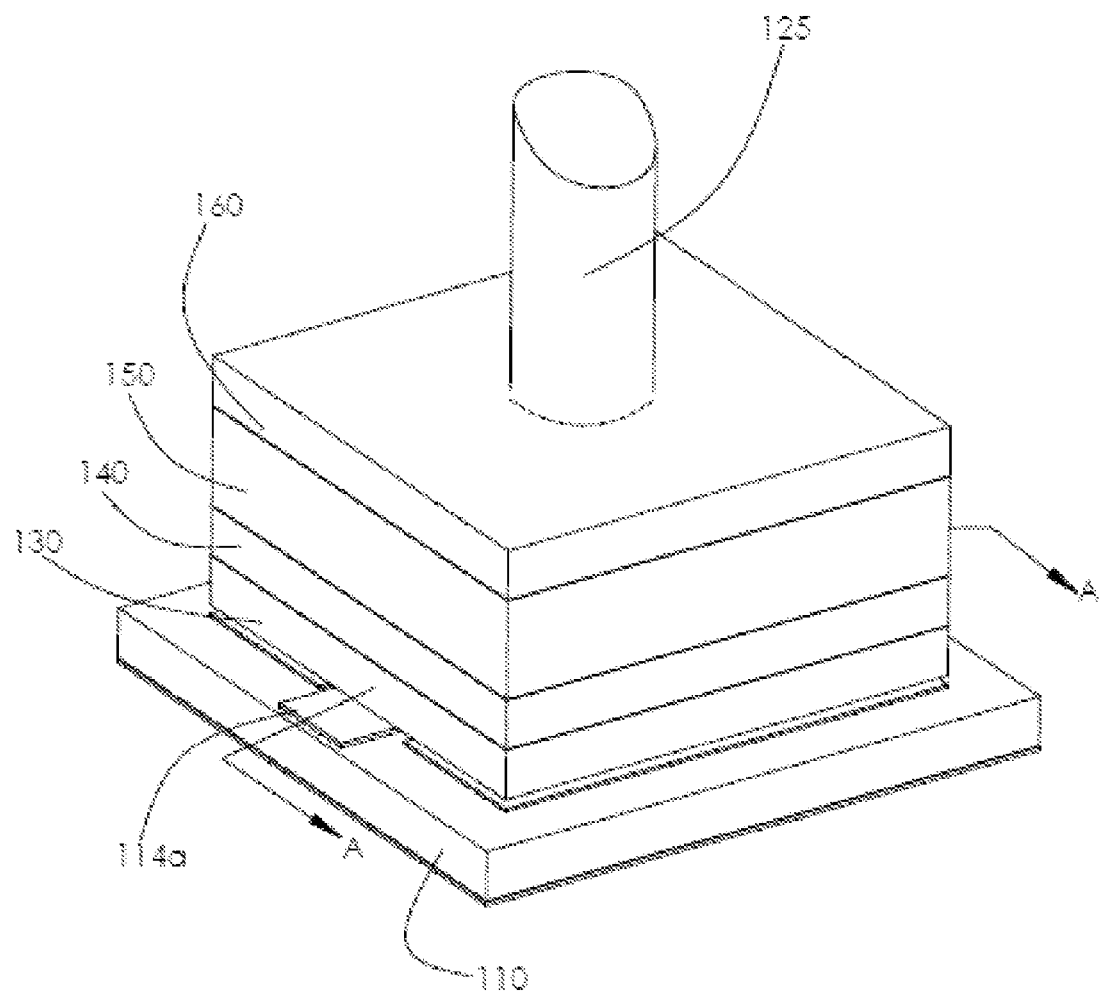
FIG. 5 illustrates an isometric view of the thermal energy transfer apparatus of FIG. 3.
Figure 6:
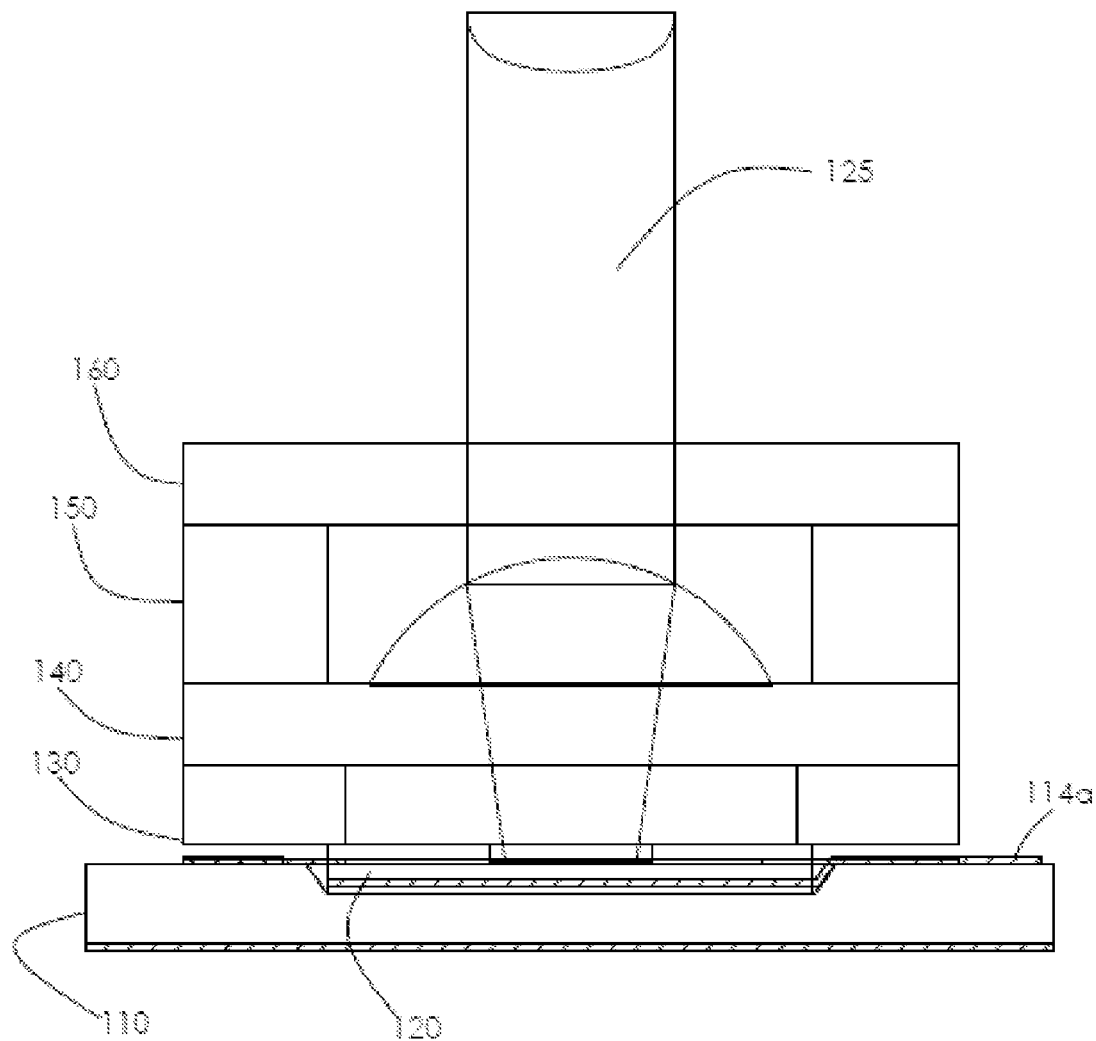
FIG. 6 illustrates a cross-sectional view of the thermal energy transfer apparatus of FIG. 5.

In at least one embodiment, the thermal energy transfer apparatus 100 may further comprise a collimating element 140 disposed on, mounted on, or otherwise bonded to, the second primary surface 130a of the cover element 130. The collimating element 140 has a lens portion 145. The lens portion 145 of the collimating element 140 collimates light 125 emitted from the light-emitting device 120 along a direction that is substantially perpendicular to the first primary surface 110a of the base plate 110 as shown in FIGS. 3-5. In at least one embodiment, the collimating element 140 is made of glass. In another embodiment, the collimating element 140 is made of polymer. Alternatively, the collimating element 140 is made of quartz.

In at least one embodiment, the thermal energy transfer apparatus 100 may further comprise a spacer element 150 disposed on, mounted on, or otherwise bonded to, the collimating element 140 such that the collimating element 140 is between the spacer element 150 and the cover element 130. The spacer element 150 has an opening 155 that accommodates at least the lens portion 145 of the collimating element 140 and allows the light 125 emitted from the light-emitting device 120 to propagate through the spacer element 150. In at least one embodiment, the spacer element 150 is made of silicon. In another embodiment, the spacer element 150 is made of ceramic.

In at least one embodiment, the thermal energy transfer apparatus 100 may further comprise a window element 160 disposed on, mounted on, or otherwise bonded to, the spacer element 150 such that the spacer element 150 is between the window element 160 and the collimating element 140. The window element 160 is substantially transparent.

In at least one embodiment, the thermal energy transfer apparatus 100 may further comprise the light-emitting device 120. The light-emitting device 120 may be, for example, a VCSEL, a LED, or another type of semiconductor-based laser or light source.

Illustrative Third Thermal Energy Transfer Apparatus

Figure 7:
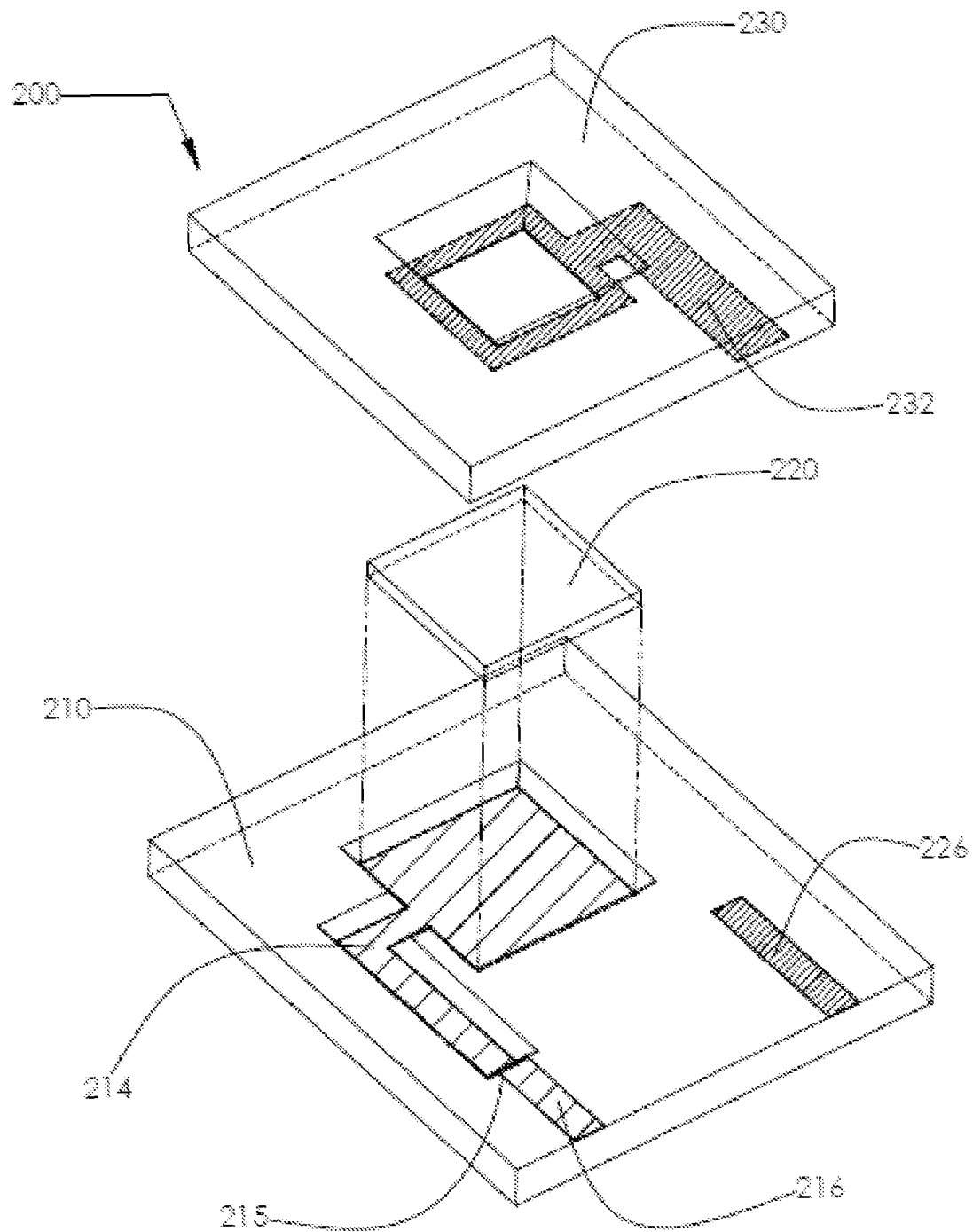
FIG. 7 illustrates an assembly view of a thermal energy transfer apparatus for a light-emitting device in accordance with another embodiment of the present disclosure.
Figure 8:
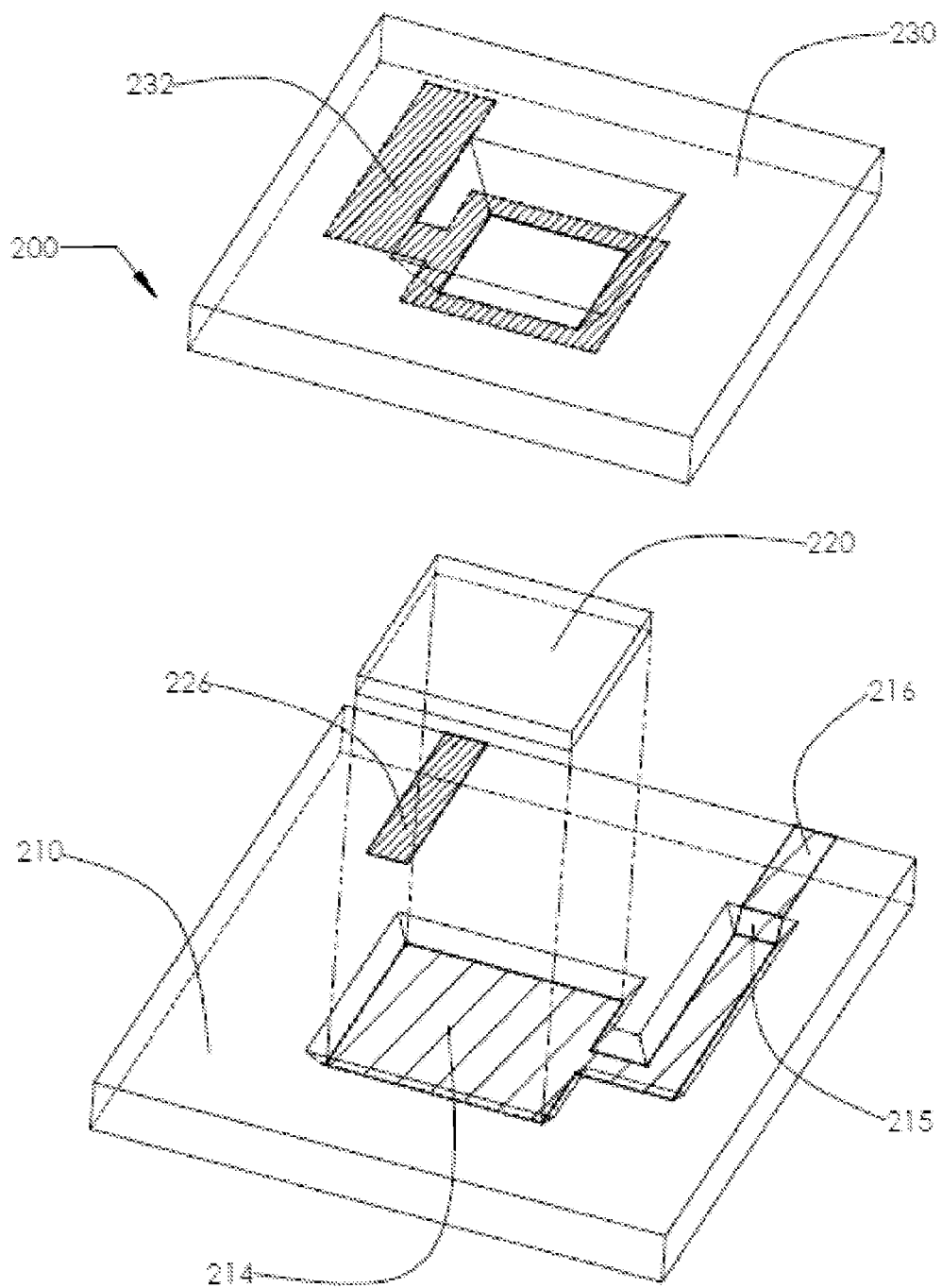
FIG. 8 illustrates another view of the thermal energy transfer apparatus of FIG. 7.
Figure 9:
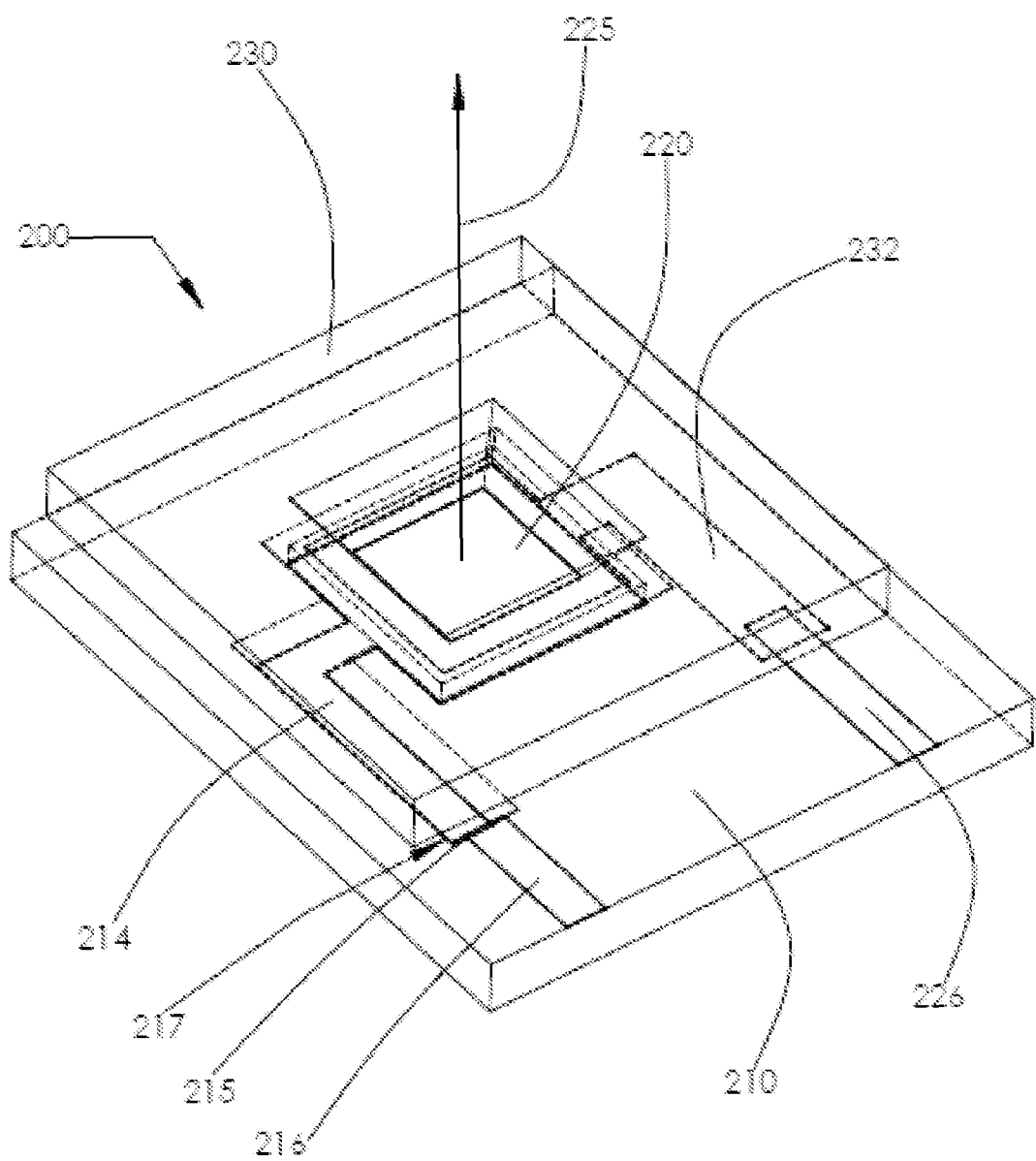
FIG. 9 illustrates an isometric view of the thermal energy transfer apparatus of FIG. 7.

FIGS. 7-9 illustrate a thermal energy transfer apparatus 200 in accordance of the present disclosure.

The apparatus 200 may comprise a base plate 210 and a cover element 230. Similar to the base plate 110 and the cover element 130, each of the base plate 210 and the cover element 230 may be made of a silicon-based material, e.g., single-crystal silicon, or alternatively, a ceramic material, e.g., aluminum nitride. Many features and functionalities of the base plate 210 and cover element 230 are similar to those of the base plate 110 and cover element 130, respectively. Thus, in the interest of brevity, the following detailed description will be directed to features and functionalities of the base plate 210 and cover element 230 that differ from those of the base plate 110 and cover element 130.

As shown in FIGS. 7-9, the base plate 210 includes a recess that is configured to receive a light-emitting device 220 therein for the light-emitting device 220 to emit a beam of photonic energy in a direction 225. The recess includes a main portion that is dimensioned to receive the light-emitting device 220 therein snugly. The recess also includes a channel portion that is connected to the main portion. A first area of the base plate 210 is coated with a first electrically-conductive pattern that forms a first electrode for powering the light-emitting diode. In particular, the first electrically-conductive pattern includes a first portion 214 disposed in the recess, a second portion 216 disposed on the non-recessed area of the first primary surface of the base plate 210, and a third portion 215 that connects the first portion 214 and the second portion 216. In other words, the first electrically-conductive pattern is contiguously coated on, deposited on, or otherwise disposed on, the recess and the non-recessed area of the base plate 210 to form a first electrode for powering the light-emitting device 220. A second area of the base plate 210 is coated with a second electrically-conductive pattern 226 that is electrically isolated from the first electrically-conductive pattern.

The cover element 230 is configured to be disposed on the base plate 210 to hold the light-emitting device 220 between the base plate 210 and the cover element 230 with at least a portion of a light-emitting surface of the light-emitting device 220 exposed. An area of the cover element 230 is coated with a third electrically-conductive pattern 232 that is in contact with the second electrically-conductive pattern 226 to form a second electrode together with the second electrically-conductive pattern 226 for powering the light-emitting device 220 when the cover element 230 is disposed on the base plate 210. The cover element 230 is not in contact with the first electrically-conductive pattern, e.g., the second portion 216, when the cover element 230 is disposed on the base plate 210. More specifically, either or both of the cover plate 230 and the channel portion of the recess on the base plate 210 may be dimensioned such that there exists a gap 217 between the cover element 230 and the second portion 216 of the first electrically-conductive pattern. This feature ensures that there is no contact between the third electrically-conductive pattern 232 and the second portion 216 of the first electrically-conductive pattern that would result in a short circuit.

In at least one embodiment, the thermal energy transfer apparatus 200 may further comprise a collimating element 140 as described above with respect to the apparatus 100.

In at least one embodiment, the thermal energy transfer apparatus 200 may further comprise a spacer element 150 as described above with respect to the apparatus 100.

In at least one embodiment, the thermal energy transfer apparatus 200 may further comprise a window element 160 as described above with respect to the apparatus 100.

In at least one embodiment, the thermal energy transfer apparatus 200 may further comprise the light-emitting device 220. The light-emitting device 220 may be, for example, a VCSEL, a LED, or another type of semiconductor-based laser or light source.

Additional Notes

The above-described techniques pertain to silicon-based thermal energy transfer for light-emitting devices. The novel thermal energy transfer apparatus advantageously removes thermal energy from a light-emitting device and allows electrical power to be provided to the light-emitting device without using wire bonding.

Although the techniques have been described in language specific to structural features and/or methodological acts, it is to be understood that the appended claims are not necessarily limited to the specific features or acts described. Rather, the specific features and acts are disclosed as exemplary forms of implementing such techniques. Furthermore, although the techniques have been illustrated in the context of cooling package for a VCSEL, the techniques may be applied in any other suitable context such as, for example, cooling package for LED.

What is claimed is:

1. An apparatus, comprising:
a silicon-based base plate, the base plate including a recess configured to receive a light-emitting device therein, a first area of the base plate coated with a first electrically-conductive pattern that forms a first electrode for powering the light-emitting diode, a second area of the base plate coated with a second electrically-conductive pattern that is electrically isolated from the first electrically-conductive pattern; and
a silicon-based cover element, the cover element configured to be disposed on the base plate to hold the light-emitting device between the base plate and the cover element with at least a portion of a light-emitting surface of the light-emitting device exposed, an area of the cover element coated with a third electrically-conductive pattern that is in contact with the second electrically-conductive pattern to form a second electrode together with the second electrically-conductive pattern for powering the light-emitting device when the cover element is disposed on the base plate.

2. An apparatus as recited in claim 1, wherein:
the base plate includes a first primary surface and a second primary surface opposite to the first primary surface, the first primary surface including:
a non-recessed area and the recess to receive the light-emitting device in the recess,
at least a portion of the recess and a first portion of the non-recessed area contiguously coated with the first electrically-conductive pattern, and
a second portion of the non-recessed area coated with the second electrically-conductive pattern; and
the cover element includes a first primary surface and a second primary surface opposite to the first primary surface, the first primary surface of the cover element coated with the third electrically-conductive pattern that is configured to be in contact with the second electrically-conductive pattern when the cover element is disposed on the base plate with the first primary surface of the cover element facing the first primary surface of the base plate.

3. An apparatus as recited in claim 2, wherein:
the recess includes a main portion and a channel portion with the main portion dimensioned to receive the light-emitting device therein;
a first part of the first electrically-conductive pattern is disposed in the main portion and the channel portion of the recess;
a second part of the first electrically-conductive pattern that is contiguous with the first part of the first electrically-conductive pattern is disposed on the first portion of the non-recessed area of the first primary surface of the base plate; and
the cover element is not in contact with the second part of the first electrically-conductive pattern when the cover element is disposed on the base plate.

4. An apparatus as recited in claim 1, further comprising:
a layer of thermally-conductive material disposed between at least a portion of the recess and at least a portion of the first electrically-conductive pattern.

5. An apparatus as recited in claim 4, wherein the layer of thermally-conductive material comprises diamond, copper, or silver.

6. The apparatus of claim 1, further comprising:
a layer of metallic material, disposed on at least a portion of the second primary surface of the base plate, that bonds the base plate to an external object.

7. An apparatus as recited in claim 1, further comprising:
a collimating element disposed on the cover element, the collimating element having a lens portion that collimates light emitted from the light-emitting device along a predefined direction.

8. An apparatus as recited in claim 7, wherein the collimating element is made of glass, polymer, or quartz.

9. An apparatus as recited in claim 7, further comprising:
a spacer element disposed on the collimating element with the collimating element disposed between the spacer element and the cover element, the spacer element having an opening that accommodates at least the lens portion of the collimating element and allows the light emitted from the light-emitting device to propagate through the spacer element.

10. An apparatus as recited in claim 9, wherein the spacer element is made of silicon or ceramic.

11. An apparatus as recited in claim 9, further comprising:
a window element disposed on the spacer element with the spacer element disposed between the window element and the collimating element, the window element being substantially transparent.

12. An apparatus as recited in claim 1, further comprising:
a vertical-cavity surface-emitting laser (VCSEL) that is received in the recess of the base plate and disposed between the base plate and the cover element to receive electrical power from the first electrode and the second electrode.

13. An apparatus as recited in claim 1, further comprising:
a light-emitting diode (LED) that is received in the recess of the base plate and disposed between the base plate and the cover element to receive electrical power from the first electrode and the second electrode.

14. An apparatus, comprising:
a base plate made of a silicon-based material or a ceramic material, the base plate including a first primary surface and a second primary surface opposite to the first primary surface, the first primary surface including:
   a non-recessed area and a recess to receive the light-emitting device in the recess,
   at least a portion of the recess and a first portion of the non-recessed area contiguously coated with a first electrically-conductive pattern that forms a first electrode for powering the light-emitting diode, and
   a second portion of the non-recessed area coated with a second electrically-conductive pattern that is electrically isolated from the first electrically-conductive pattern; and
a cover element made of a silicon-based material or a ceramic material, the cover element configured to be disposed on the base plate to hold the light-emitting device between the base plate and the cover element, the cover element including:
   a first primary surface that is coated with a third electrically-conductive pattern, the third electrically-conductive pattern configured to be in contact with the second electrically-conductive pattern to form a second electrode for powering the light-emitting device when the cover element is disposed on the base plate with the first primary surface of the cover element facing the first primary surface of the base plate,
   a second primary surface opposite to the first primary surface, and
   an opening communicatively connecting the first primary surface of the cover element and the second primary surface of the cover element, the opening exposing at least a portion of a light-emitting surface of the light-emitting device.

15. An apparatus, comprising:
a base plate made of a silicon-based material or a ceramic material, the base plate including a first primary surface and a second primary surface opposite to the first primary surface, the first primary surface including:
   a non-recessed area and a recess to receive the light-emitting device in the recess,
   at least a portion of the recess and a first portion of the non-recessed area contiguously coated with a first electrically-conductive pattern that forms a first electrode for powering the light-emitting diode,
   a layer of thermally-conductive material disposed between at least a portion of the recess and at least a portion of the first electrically-conductive pattern, and
   a second portion of the non-recessed area coated with a second electrically-conductive pattern that is electrically isolated from the first electrically-conductive pattern; and
a cover element made of a silicon-based material or a ceramic material, the cover element configured to be disposed on the base plate to hold the light-emitting device between the base plate and the cover element with at least a portion of a light-emitting surface of the light-emitting device exposed, the cover element including:
   a first primary surface that is coated with a third electrically-conductive pattern, the third electrically-conductive pattern configured to be in contact with the second electrically-conductive pattern to form a second electrode for powering the light-emitting device when the cover element is disposed on the base plate with the first primary surface of the cover element facing the first primary surface of the base plate, and
   a second primary surface opposite to the first primary surface.

* * * * *